US007163850B2

(12) United States Patent
Oda et al.

(10) Patent No.: US 7,163,850 B2
(45) Date of Patent: *Jan. 16, 2007

(54) BOTTOM GATE-TYPE THIN-FILM TRANSISTOR AND METHOD FOR MANUFACTURING THE SAME

(75) Inventors: Nobuhiko Oda, Hashima (JP); Toshifumi Yamaji, Aichi (JP); Shiro Nakanishi, Ogaki (JP); Yoshihiro Morimoto, Inazawa (JP); Kiyoshi Yoneda, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/945,233

(22) Filed: Sep. 20, 2004

(65) Prior Publication Data

US 2005/0035348 A1 Feb. 17, 2005

Related U.S. Application Data

(63) Continuation of application No. 10/008,389, filed on Nov. 6, 2001, now Pat. No. 6,815,272.

(30) Foreign Application Priority Data

Nov. 7, 2000 (JP) ............................ 2000-338708

(51) Int. Cl.
*H01L 21/00* (2006.01)

(52) U.S. Cl. ....................... 438/154; 438/149; 438/153

(58) Field of Classification Search ................ 438/149, 438/158, 315, 334, 163, 166; 257/69, 77, 257/59, 72, 347; 349/42–43

See application file for complete search history.

(56) References Cited

U.S. PATENT DOCUMENTS 5,229,334 A 7/1993 Kato
5,281,546 A 1/1994 Possin et al.
5,733,804 A 3/1998 Hack et al.
5,814,530 A * 9/1998 Tsai et al. ..................... 438/30

(Continued)

FOREIGN PATENT DOCUMENTS

JP 11-74535 3/1999

(Continued)

OTHER PUBLICATIONS

Copy of Japanese Patent Laid-Open Publication No. Hei 9-263974 with English abstract.

(Continued)

*Primary Examiner*—Thao X. Le
(74) *Attorney, Agent, or Firm*—Cantor Colburn LLP

(57) ABSTRACT

In a bottom gate-type thin-film transistor manufacturing method, after ion doping, an ion stopper (55) is removed. The ion stopper (55) does not remain in the interlayer insulating film (8) lying immediately above the gate electrode. The thin-film transistor has such a structure that no ion stopper (55), and the interlayer insulating layer is in direct contact with at least the channel region of the semiconductor layer (4). The impurity concentration in the vicinity of the interface between the interlayer insulating film and the semiconductor layer 4 is $10^{18}$ atoms/cc or less. This structure can prevent the back channel phenomenon and reduce variations in characteristic resulting from variations in manufacturing.

7 Claims, 7 Drawing Sheets

9
4C
9
9
4C
9
8
4
3
1
2N
2P

U.S. PATENT DOCUMENTS 5,821,137 A * 10/1998 Wakai et al. ............... 438/163
5,943,593 A 8/1999 Noguchi et al.
5,986,306 A 11/1999 Nakajima et al.
6,017,779 A 1/2000 Miyasaka
6,107,640 A 8/2000 Park et al.
6,160,268 A 12/2000 Yamazaki
6,197,624 B1 3/2001 Yamazaki
6,281,552 B1 * 8/2001 Kawasaki et al. .......... 257/350
6,372,618 B1 4/2002 Forbes et al.
6,376,290 B1 4/2002 Gosain et al.
6,380,011 B1 4/2002 Yamazaki et al.
6,388,291 B1 5/2002 Zhang et al.
6,424,012 B1 * 7/2002 Kawasaki et al. .......... 257/350
6,479,837 B1 * 11/2002 Ogawa et al. ................ 257/59
6,501,098 B1 12/2002 Yamazaki
6,570,552 B1 5/2003 Kamazaki
6,614,076 B1 9/2003 Kawasaki et al.
6,808,965 B1 10/2004 Miyasaka et al.
6,815,272 B1 * 11/2004 Oda et al. .................. 438/158
2002/0055207 A1 5/2002 Kunil

FOREIGN PATENT DOCUMENTS

JP 2000-286423 10/2000
KR 1999-0088504 12/1999

OTHER PUBLICATIONS

Office Action for Korean Patent Application No. 10-2001-0068784 dated Feb. 23, 2004.

* cited by examiner

BOTTOM GATE-TYPE THIN-FILM TRANSISTOR AND METHOD FOR MANUFACTURING THE SAME

CROSS REFERENCE TO RELATED APPLICATIONS

This application is a continuation of U.S. patent application Ser. No. 10/008,389, filed on Nov. 6, 2001 now U.S. Pat. No. 6,815,272, which is herein incorporated by reference in its entirety.

BACKGROUND OF THE INVENTION

1. Field of the Invention

The present invention relates to a thin-film transistor (TFT) and to a method of manufacturing the same. Particularly, the present invention relates to a method of manufacturing a bottom gate-type thin-film transistor in which the gate electrode is disposed on the side of the substrate rather than the side of the semiconductor layer.

2. Description of Related Art

In active matrix-type liquid crystal displays (LCDS) or organic electroluminescence (EL) displays, a substrate is generally used in which drive circuits and TFTs for selecting a pixel are formed on a transparent insulating substrate made of material such as glass. In order to form semiconductor elements on the transparent substrate, it is impossible to implement a high temperature process and to diffuse impurities into the transparent substrate. This differs from the case where the silicon substrate is used. Hence, when semiconductor elements are formed on a glass substrate, an approach different from the method of forming semiconductor elements on a silicon substrate must be employed.

One conventional method of forming bottom gate-type TFTs on a glass substrate will be described below. Referring to FIGS. 1A to 1E, a P-channel TFT is depicted on the right side while an N-channel TFT is depicted on the left side.

Step 1: As shown in FIG. 1A, a conductive film of a refractory (high-melting point) metal such as chromium is formed on the glass substrate 51. The conductive film is etched in a predetermined pattern to form a gate electrode 52. Next, a gate insulating film 53, which is a laminated structure of a silicon dioxide and a silicon nitride, is formed covering the gate electrodes 52, and then a semiconductor layer 54 of a silicon, and an ion stopper 55 of a silicon dioxide are sequentially formed.

Step 2: As shown in FIG. 1B, a photoresist film is coated over the entire intermediate structure. Light is illuminated onto the photoresist film from the side of the substrate 51. Using the gate electrode 52 as a mask, the photoresist film is exposed to light and developed to form a resist mask 56. N-type impurities are implanted or doped at a low concentration into the semiconductor layer 54 while the resist mask 56 and the ion stopper 55 are used as a mask. Thus, an $N^-$ region is formed. Since the resist mask 56 is formed, with the gate electrode 52 acting as a mask, the $N^-$ region is self-aligned with the gate electrode 52.

Step 3: As shown in FIG. 1C, a resist mask 57 is formed to completely cover the P-channel TFT and is slightly larger than the gate electrode 52 of the N-channel TFT. N-type impurities are heavily implanted into the semiconductor layer 54 to form an $N^+$ region. Thus, an LDD (lightly Doped Drain) structure can be obtained.

Step 4: As shown in FIG. 1D, the resist mask 57 is removed. A resist mask 58 is newly formed to cover the N-channel TFT. Next, P-type impurities are doped into the semiconductor layer 54, with the ion stopper 55 acting as a mask, to form a $P^+$ region. Because the ion stopper 55 is formed to act as a mask for the gate electrode 52, the $P^+$ region is aligned with the gate electrode 52.

Step 5: As shown in FIG. 1E, an interlayer insulating film 59 formed of a laminated structure of silicon dioxide and silicon nitride is formed all over the intermediate structure. At this point, because the interlayer insulating film 59 is integrated with the ion stopper 55, the boundary becomes unclear. Next, contact holes are opened in the interlayer insulating film 59 at predetermined positions. Thereafter, the source electrodes 60 and the drain electrodes 60 are formed to complete the TFTs.

As described above, in Step 4, the P-type impurities are doped while the ion stopper 55 is used as a mask. At the same time, the P-type impurities are doped into the semiconductor layer 54 and the stopper 55.

However, there is variation in the operational characteristics of bottom gate-type thin-film transistor produced through the above-described process. It is considered that variations in the TFT characteristics are caused by an occurrence of back channel. It has also been considered that such back channel results from other wire layer or electrodes disposed above the semiconductor layer 54 via the thick insulating layer formed of at least the ion stopper 55 and the interlayer insulating film 59. However, the characteristics of the bottom gate-type thin-film transistor vary over the expected effect of a back channel caused by such the conductive layer. Reduction in variation of characteristics resulting from the back channel, regardless of root cause, has long been desired in the field.

SUMMARY OF THE INVENTION

An object of the present invention is to provide a method of manufacturing a bottom gate-type thin film transistor in which variations in characteristics can be reduced.

Another object of the present invention is to provide a bottom gate-type thin film transistor produced by the above-described method.

The present invention is made to solve the above-described problems. According to the present invention a bottom gate-type thin-film transistor comprises a gate electrode formed on a transparent insulating substrate; a gate insulating film overlying the gate electrode; and a semiconductor layer formed on the gate insulating film, the semiconductor layer having source and drain regions doped with impurities, and a channel region; an interlayer insulating film is formed on the semiconductor layer; and in said interlayer insulating film, a region in a vicinity of at least an interface between at least the channel region in the semiconductor layer and the interlayer insulating film has an impurity concentration of $10^{18}$ atom/cc or less.

The present applicant has studied variations in characteristic of a bottom gate-type thin-film transistor produced according to conventional methods. As a result, the present inventors found out that impurities in the interlayer insulating film 59 covering the channel region of the TFT induce back channel, thus influencing the characteristic variations. Conventionally, for example, as shown in FIG. 1D, P-type impurities are doped into the semiconductor layer 54 to form a P-channel TFT while the ion stopper 55 acts as a mask. The impurity concentration is set to a sufficiently heavy value to form the source region and the drain region in the semiconductor layer 54. P-type impurities such as boron or N-type impurities such as phosphorus and arsenic are heavily doped into even the ion stopper 55. The impurities are heavily doped into the interlayer insulating film 59 and reside therein. The remaining impurities cause variations in the gate threshold of the TFT.

According to the present invention, a region of said interlayer insulating film at least in the vicinity of the interface between the interlayer insulating film and the channel region of the semiconductor layer, the doping concentration of impurities for activating the semiconductor layer is set to $10^{18}$ atoms/cc or less. Because this configuration suppresses the occurrence of back channel resulting from the impurities contained in the interlayer insulating film, variations in the TFT characteristics can be decreased.

In another aspect of the present invention, a bottom gate-type thin-film transistor comprises a gate electrode formed on a transparent insulating substrate; a gate insulating film overlying the gate electrode; a semiconductor layer formed on the gate insulating film, the semiconductor layer having a source and a drain region, impurities being doped, and a channel region; and an interlayer insulating film formed on the semiconductor layer, wherein both the interlayer insulating film and the semiconductor layer are in direct contact each other and are disposed above the gate electrode.

As described above, in the bottom gate-type thin-film transistor according to the present invention, the interlayer insulating film is in direct contact with the semiconductor layer; the ion stopper does not intervene. This structure can prevent the back channel phenomenon caused by impurities contained in the interlayer insulating film. Therefore, manufacturing variations among bottom gate-type thin-film transistors can be reduced.

According to another aspect of the invention, a method for manufacturing a bottom gate-type thin-film transistor on a transparent insulating substrate comprises the steps of forming a gate electrode on a transparent substrate; forming a gate insulating film on the gate electrode; forming a semiconductor layer on the gate insulating film; forming a mask on the semiconductor layer corresponding to the gate electrode; doping impurities selectively into the semiconductor layer, using the mask; and forming an interlayer insulating film on the semiconductor layer, after removal of the mask.

According to the present invention, a bottom gate-type thin-film, which has characteristics identical to that of the prior art, can be easily produced without forming the problematic stopper insulating film which leads to decreases in characteristic.

Moreover; before formation of the mask, a native oxide film may be formed on the semiconductor layer. After removal of the mask, residue of the mask may be removed together with the native oxide film.

Moreover, a dilute hydrofluoric acid may be used to remove the native oxide film.

As described above, the resist mask can be removed together with the native oxide film such that it will not remain between the semiconductor layer and the interlayer insulating film. As a result, a bottom gate-type thin-film transistor with excellent characteristics can be produced.

BRIEF DESCRIPTION OF THE DRAWINGS

These and other objects, features, and advantages of the present invention will become more apparent from the following detailed description taken in conjunction with the attached drawings, in which.

DESCRIPTION OF THE EMBODIMENTS

A first embodiment according to the present invention will be explained below by referring to the attached drawings.

Figure 1A:
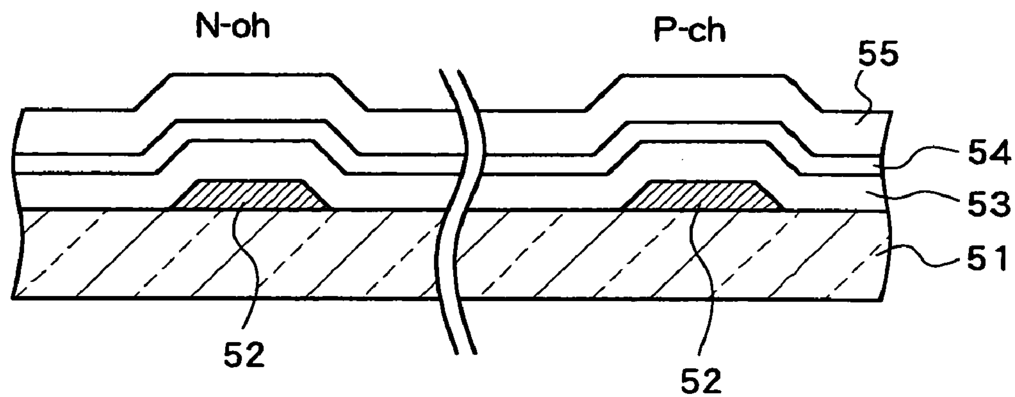
FIGS. 1A, 1B, 1C, 1D, and 1E are cross sectional views each illustrating a conventional method for manufacturing a bottom gate-type thin film transistor.
Figure 1B:
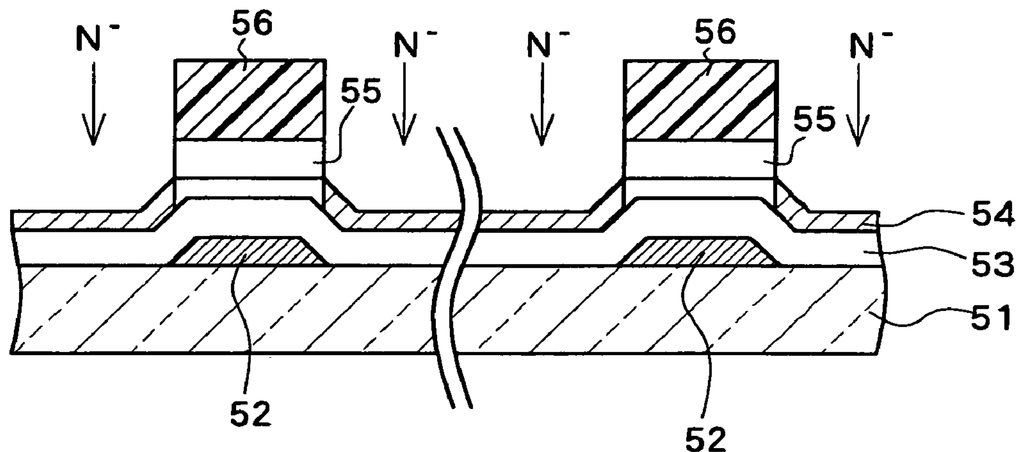
Figure 1C:
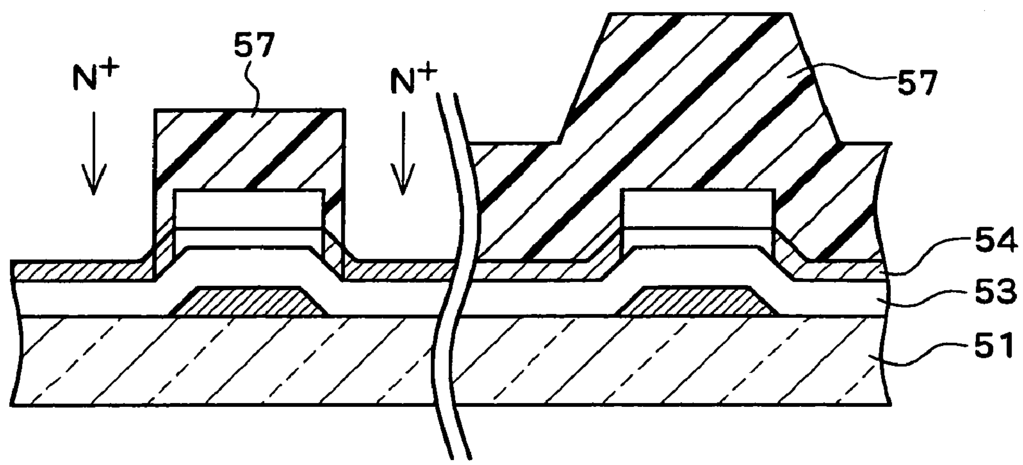
Figure 1D:
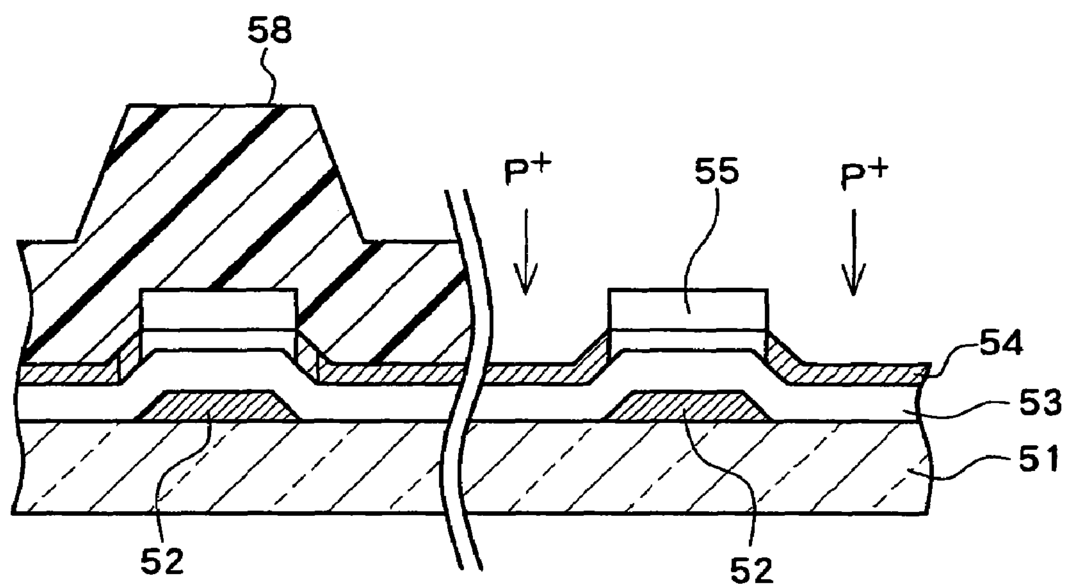
Figure 1E:
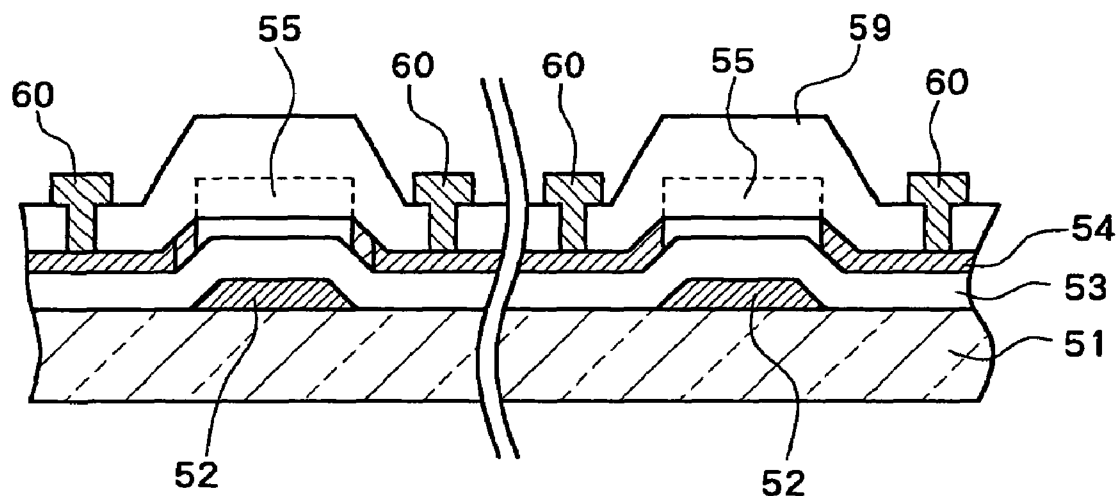
Figure 2A:
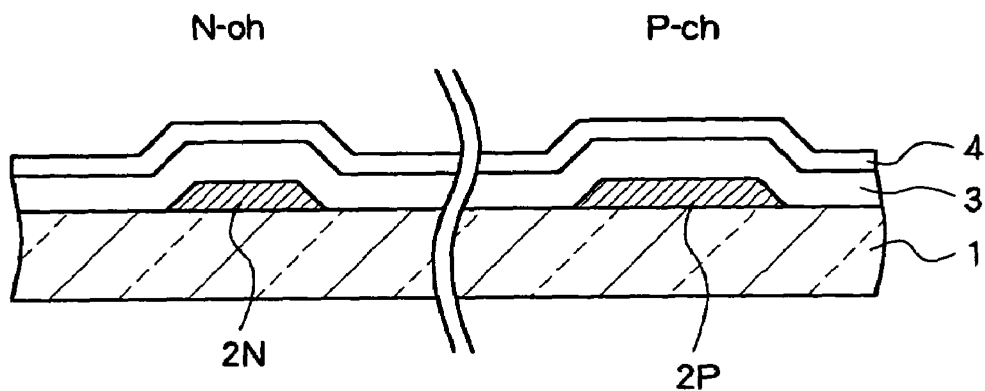
FIG. 2A, 2B, 2C, 2D, and 2E are cross sectional views each illustrating a method for manufacturing a bottom gate-type thin film transistor, according to a preferred embodiment of the present invention.

Step 1: As shown in FIG. 2A, a refractory metal such as chromium is sputtered on a glass substrate 1 to form a conductive film of a thickness of 1000 Å to 2000 Å. The conductive film is etched in a predetermined pattern to form a gate electrode 2 (2N, 2P). At this time, the gate electrode 2P of a P-channel TFT is formed to be about 10% larger than the conventional gate electrode 52 in the channel length direction. Next, a gate insulating film 3 having a thickness of 1000 Å to 2000 Å is formed over the gate electrode 2 by chemical vapor deposition (CVD). The gate insulating film 3 has a laminated structure of a silicon dioxide and a silicon nitride. Next, a semiconductor layer 4 of a non-crystalline silicon or a polycrystalline silicon being a crystallized non-crystalline silicon is formed to be a thickness of 300 Å to 500 Å. The non-crystalline silicon is formed through CVD and is crystallized through the excimer laser anneal (ELA) into a polycrystalline silicon.

Figure 2B:
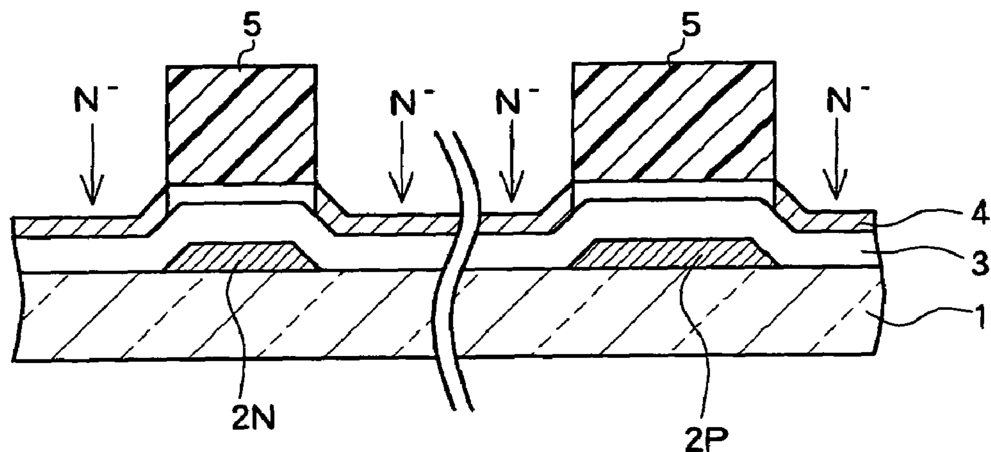

Step 2: A photoresist is applied over the entire surface of the intermediate structure. The photoresist layer is exposed to ultraviolet radiation illuminated from the side of the substrate 1 and then developed, with the gate electrode 2 acting as a mask. Thus, a resist mask 5 is formed as shown in FIG. 2B. Next, N-type impurities are lightly doped at a concentration of about $10^{14}$ atoms/cc into the semiconductor layer 4 to form the $N^-$ region while the resist mask 5 acts as a mask. Because the gate electrode 2 acts as a mask during formation of the resist mask 5, the $N^-$ region is self-aligned with the gate electrode 2.

Figure 2C:
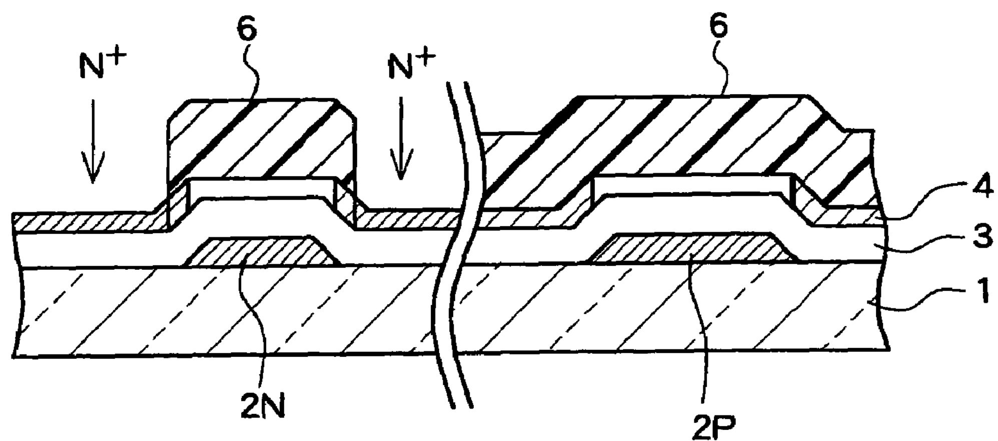

Step 3: As shown in FIG. 2C, a photoresist is applied over the entire surface of the intermediate structure. A resist mask 6 is formed using a mask (not shown). The resist mask 6 completely covers the P-channel TFT and is somewhat larger than the gate electrode 2N of the N-channel TFT. N-type impurities are heavily doped into the semiconductor layer 4 to form an $N^+$ region. Thus, the source region and the drain region are formed as an LDD structure.

Figure 2D:
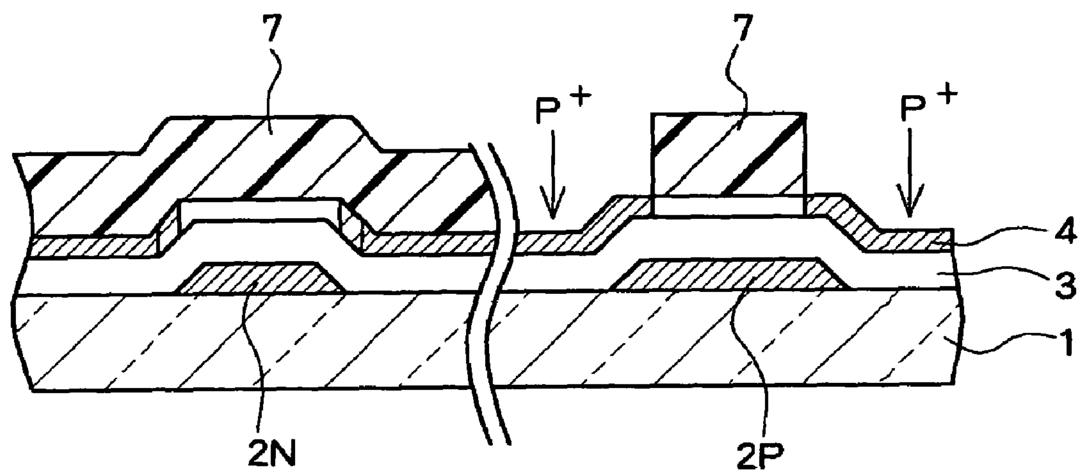

Step 4: As shown in FIG. 2D, a resist mask 7 is formed so as to cover the N-channel TFT. The resist mask 7 is 10% shorter than the gate electrode 2 of the P-channel TFT in the channel length direction. P-type impurities such as boron are doped into the semiconductor layer 4 to form a source region and a drain region, while the photoresist mask 7 is used as a mask.

Figure 2E:
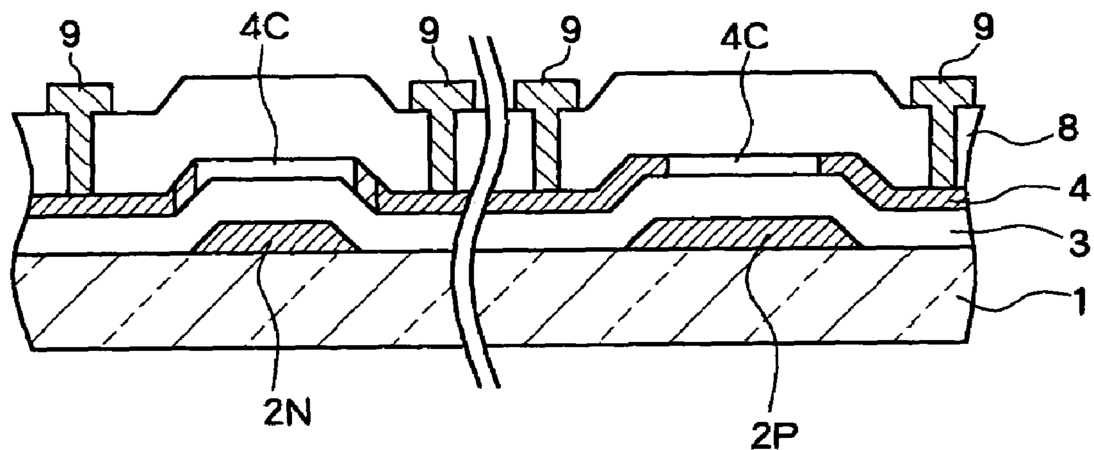

Step 5: As shown in FIG. 2E, the resist mask 7 is removed. Thereafter, using a CVP process, an interlayer insulating film 8 of silicon dioxide is formed at a thickness of 4000 Å to 5000 Å all over the surface of the intermediate structure. Next, contact holes are formed at predetermined positions on the interlayer insulating film 8. Then, a source electrode 9 and a drain electrode 9 are formed. Finally, a TFT is produced.

According to the present embodiment, in the doping process into the semiconductor layer 4, P-type impurities are doped into the resist mask 7 simultaneously with doping into the semiconductor layer 4. However, the resist mask 7 is removed and is not present in the completed TFT. In other words, immediately above the gate electrode 2, the semiconductor layer 4 and the interlayer insulating film 8 are in direct contact and are not separated by the ion stopper 55. In contrast to cases where the ion stopper 55 is not removed, the concentration of impurities contained in the insulating film immediately above the gate electrode 2 of the semiconductor layer 4 (that is, on the channel region 4*c* of the semiconductor layer 4) is less than $10^{18}$ atoms/cc. This helps prevents occurrence of the back channel phenomenon. As a result, bottom-gate thin-film transistors with stable operational characteristics can be produced at high manufacturing yields.

In Step 1, the length of the gate electrode 2*p* is extended by 10%. In Step 4, the resist mask 7 is shortened by 10%. Such a process allows the channel length of the produced TFT to be equal to that in the prior art. In such a condition, with the resist mask 7 not aligned with gate electrode 2P and as long as the shift is less than 10% of the channel length, the TFT does not erroneously operate.

Figure 3:
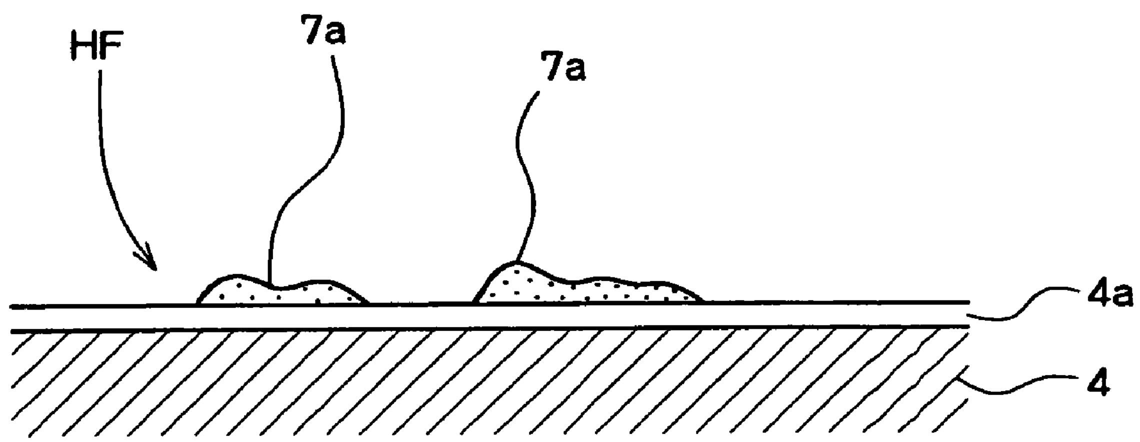
FIG. 3 is an enlarged cross-sectional view explaining a resist mask removal step.
Figure 4A:
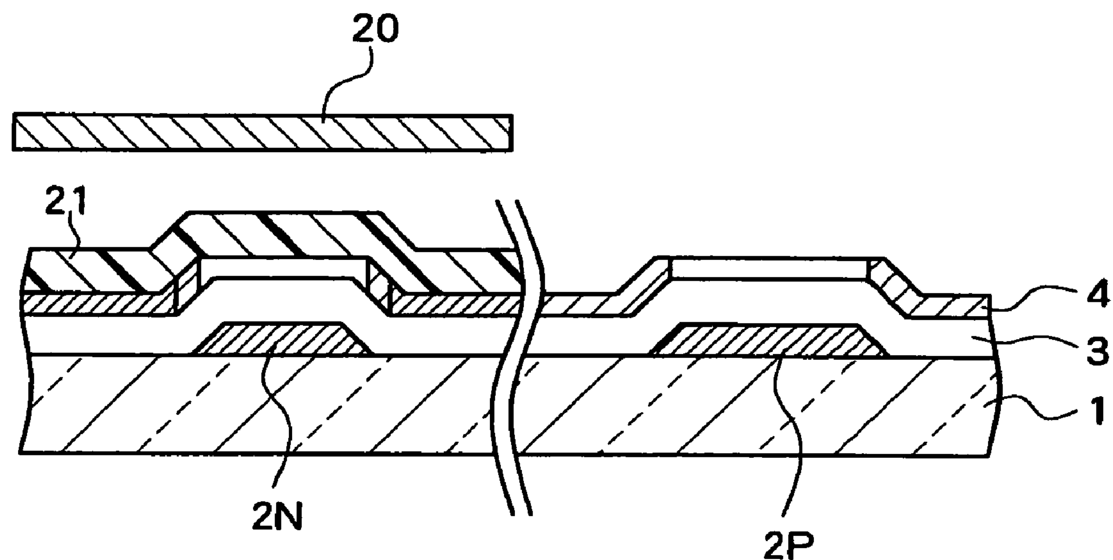
FIGS. 4A and 4B are cross sectional views each illustrating a method for manufacturing a bottom gate-type thin film transistor, according to an embodiment of the present invention.
Figure 4B:
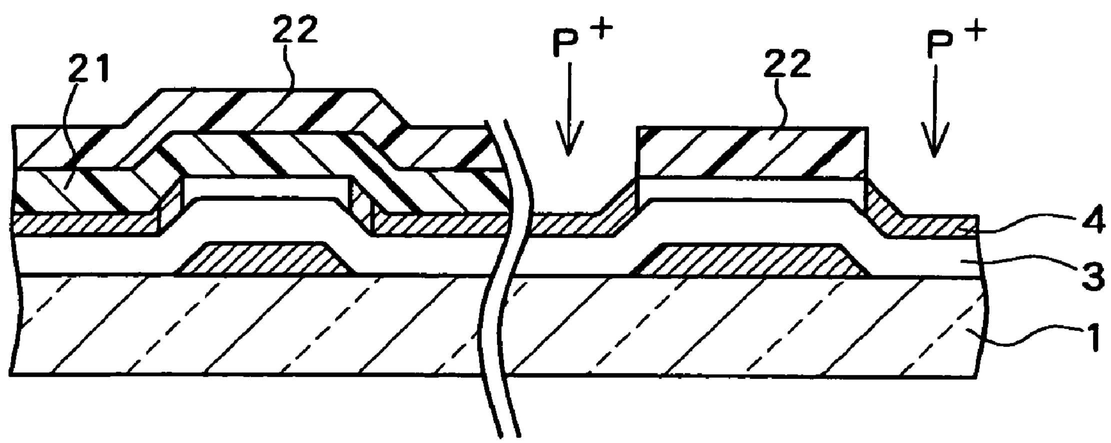

The semiconductor layer 4 acts as the channel 4*c* in the operation of the TFT. It is very important to better the interface between the semiconductor layer 4 and the interlayer insulating film 8. Conventionally, the ion stopper 55 is piled up immediately after the formation of the semiconductor layer 4 and has a role of protecting the interface of the semiconductor layer 4. In contrast, according to the manufacturing method of the present invention, the resist mask 7 formed directly on the semiconductor layer 4 must be removed after formation. Because residue of the resist mask 7 may contain doped impurities, it should be carefully ensured that no residue of the resist mask 7 is left on the semiconductor layer 4. Because physical properties of the resist mask 7 such as dielectric constant differ from those of the interlayer insulating film 8, any residue adversely affects the operation characteristics of a TFT and causes variations in operation characteristics. FIG. 3 is an enlarged cross-sectional view illustrating the state immediately after the resist mask 7 is removed from above the semiconductor layer 4. Before the formation of the resist mask 7, a very thin native oxide film 4*a*, on the order of 10 Å to several tens of Å, is formed on the surface of the semiconductor layer 4. When exposed to the atmosphere, the semiconductor layer 4 reacts with the oxygen in the air, such that native oxide is formed in a very short time. A minute amount of the reside 7*a* of the resist mask 7 may remain on the native oxide film 4*a*. When the native oxide film 4*a* is removed using, for example, a dilute hydrofluoric acid (DHF) of 1% to 5%, the residue 7*a* of the resist mask 7 is simultaneously removed.

During solution cleaning in accordance with etching in the lift-off method, solution remaining on the glass substrate may react with the substrate and cause dimming. This method is therefore not usually used when thin film transistors are formed on a glass substrate. The present embodiment employs the so-called spin etcher method, in which the glass substrate is spun a predetermined number of revolutions to spread a dilute hydrofluoric acid over the glass substrate. The spin etcher spins away, or scatters, the dilute hydrofluoric acid on the surface of the substrate and prevents the dilute hydrofluoric acid from invading the back of the substrate, thereby preventing dimming.

Moreover, in the lift-off method, immersion of the substrate into a buffered hydrofluoric acid prepared by mixing a hydrofluoric acid and an ammonium fluoride with an acetic acid may be considered. However, in this method a great deal of time is required to completely remove the resist mask. Moreover, immersing the substrate in the buffered hydrofluoric acid for the time period during which the native oxide film is completely removed may cause the substrate to be eroded. For that reason, with the lift-off method, use of the spin etcher is preferable.

Next, a second preferred embodiment of the present invention will be described.

In this embodiment, steps 1 to 3 are identical to those in the first embodiment and their explanation will not be repeated.

Step 4: A photoresist is coated over the entire surface of the intermediate structure. The photoresist is subjected to the exposure process and the development process while the mask 20 covers the N-channel TFT. Thus, the resist mask 21 is formed to cover the N-channel TFT while the P-channel TFT is exposed.

Step 5: Next, a photoresist is coated over the entire surface of the intermediate structure. The photoresist is exposed and developed from the side of the substrate 1 while the gate electrode 2 is used as a mask. The resist mask 22 is self-aligned with the gate electrode 2P of the P-channel TFT. Using the resist mask 22 as a mask, P-type impurities are doped into the semiconductor layer 4.

Step 6: After removal of the resist masks 21 and 22, interlayer insulating film 8, the source electrode 9 and the drain electrode 9 are formed in accordance with the step 5 in the first embodiment. Thus, a TFT is produced.

In this second preferred embodiment, the resist film 22 is also removed as described in the first embodiment. The region which neighbors the channel of the interlayer insulating film 8 formed on the semiconductor layer 4 constructing the TFT contains impurities in a concentration of less than $10^{18}$ atoms/cc, thereby preventing the occurrence of the back channel phenomenon. As a result, a bottom gate-type thin-film transistor with stable operation characteristics can be manufactured at high manufacturing yields.

Particularly, according to the present embodiment, because impurities can be doped in a self-alignment state into the gate electrode 2P of the P-channel TFT, the N-channel gate electrode 2N and the P-channel gate electrode 2P can be made to have the same size. When the conventional manufacturing method is converted to the manufacturing method in the present invention, no design changes are required. As a result, the present invention has an additional advantage in that the manufacturing method can be easily implemented. On the contrary, because the resist mask 21 formed on the N-channel is exposed twice, the photoresist is cured excessively. As a result, the hardened photoresist cannot be perfectly removed with the same remover and in the same amount of time as those applied in other steps. Hence, a solution having a concentration higher than that of the solution used in other steps, or immersion of the substrate in the solution for a longer time, is required.

Figure 5:
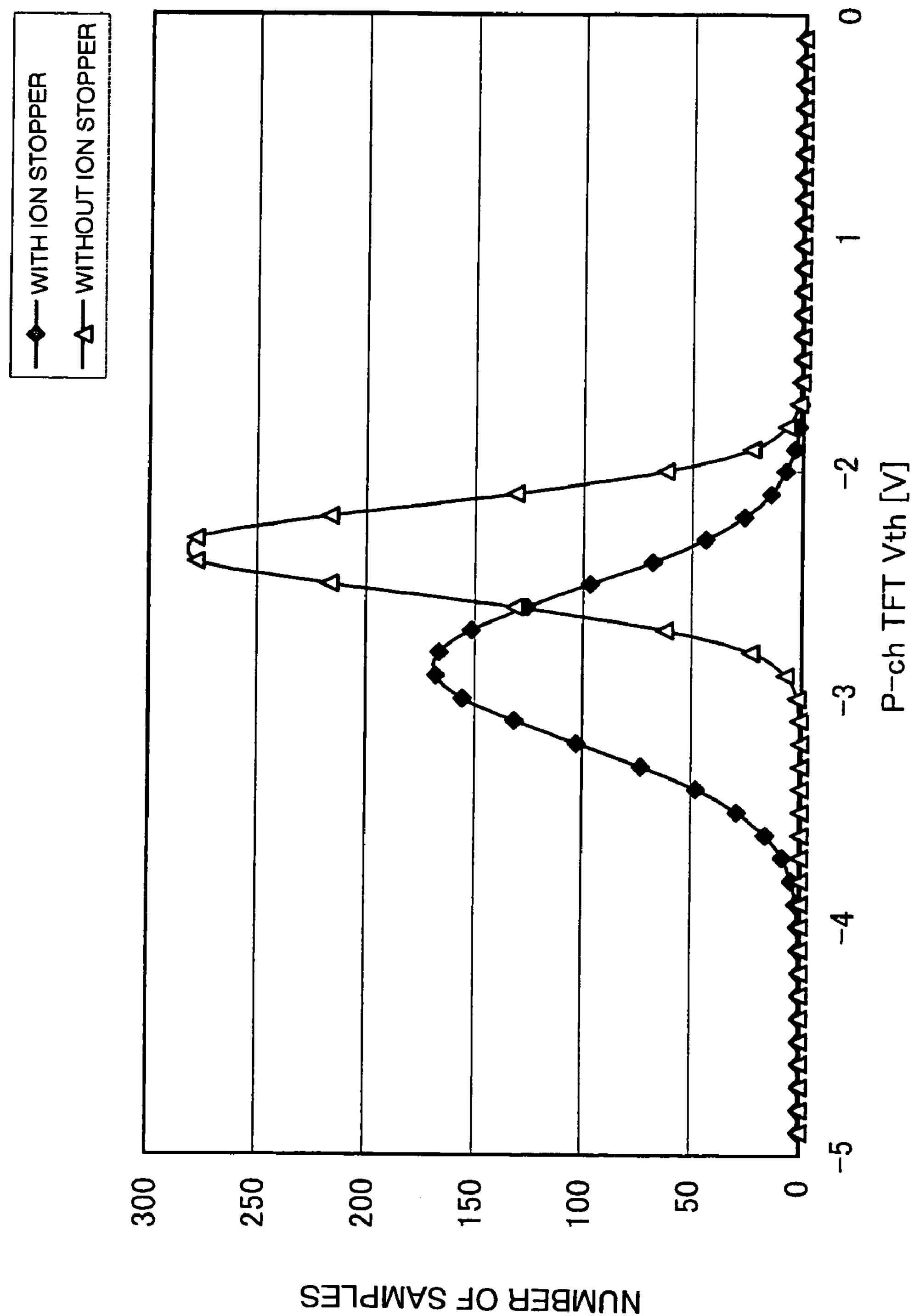
FIG. 5 is a diagram showing variations in the threshold voltages in a TFT having an ion stopper (conventional TFT) and a TFT with no ion stopper (present invention).

Referring to FIG. 5, characteristic variations are compared between a conventional bottom gate type TFT in which an ion stopper remains formed in an interlayer insulating film and a bottom gate type TFT according to the present invention in which an interlayer insulating film is formed after removal of an ion stopper so that, in its final form, the TFT does not include an ion stopper. As shown in FIG. 5, with regard to the conventional bottom gate type TFF with an ion stopper, values of a threshold voltage (on voltage) Vth of sample P-channel type TFTs are distributed over a wide range between −3.8V to −1.8V. In order to achieve reliable on-off control for the TFT having such characteristic variations, it is necessary to set, for example, the absolute value of the gate voltage to a very high value. On the other hand, with regard to the bottom gate type TFT without an ion stopper as in the present invention, values of a threshold voltage Vth of the sample P-channel type TFTs are distributed only in a narrow range (−2.8V to −1.8V), and most voltage values for the samples are the same, as shown in FIG. 5. As can be expected from the above, when a region into which impurities are highly doped, such as an ion stopper, resides on the channel region, even in the insulting film, of the bottom gate type TFT, back channel or the like inevitably occurs, resulting in significant deterioration of the TFT characteristics. According to the present invention, such variations in TFT characteristics can be significantly reduced, so that the TFT can be controlled with high accuracy by application of a minimum gate voltage.

What is claimed is:

1. A method for manufacturing bottom gate-type thin-film transistors on a transparent insulating substrate, comprising:

forming a first gate electrode and a second gate electrode on a transparent substrate such that said second gate electrode is wider than said first gate electrode;

forming a gate insulating film on said first and second gate electrodes;

forming a semiconductor layer on said gate insulating film;

forming a first mask with a first resist film having openings above both sides of said first gate electrode and doping impurities using said first mask, wherein a width of a portion of said first resist film above said first electrode is larger than a width of said first gate electrode;

removing said first resist film without performing heat treatment;

forming a second mask with a second resist film having openings above both sides of said second gate electrode and doping impurities using said second mask, wherein a width of a portion of said second resist film above said second gate electrode is smaller than a width of said second gate electrode;

removing said second resist film without performing heat treatment; and forming an interlayer insulating film on said semiconductor layer, wherein said interlayer insulation film directly contacts said semiconductor layer in a part above each of said first and second gate electrodes, wherein said first and second masks are configured and dimensioned to prevent impurity doping to a channel region.

2. A method defined in claim 1, further comprising:

removing, after removal of said first and second masks, residue of said first and second masks, together with a native oxide film formed on said semiconductor layer before formation of said first and second masks.

3. A method defined in claim 2, wherein removing said native oxide film by a dilute hydrofluoric acid.

4. A method defined in claim 1, wherein a region doped with impurities in said semiconductor layer thereof overlaps said second gate electrode.

5. A method for manufacturing bottom gate-type thin-film transistors on a transparent insulating substrate, comprising:

forming a first gate electrode and a second gate electrode on a transparent substrate such that second gate electrode is wider than said first gate electrode;

forming a gate insulating film on said first and second gate electrodes;

forming a semiconductor layer on said gate insulating film;

forming a first mask with a first resist film having openings above both sides of said first gate electrode and doping first conductivity type impurities, wherein a width of a portion of said first resist film above said first gate electrode is larger than a width of said first gate electrode;

removing said first resist film;

forming a second mask with a second resist film so as to cover regions above said second electrode and both sides of said first electrode;

forming a third resist film and performing exposure of regions of said third resist film above both side of said second gate electrode using said second gate electrode as a mask;

forming a third mask by removing said exposed regions of said third resist film;

doping second conductivity type impurities using said third mask;

removing said second and third resist films without performing heat treatment;

forming an interlayer insulating film on said semiconductor layer, wherein said interlayer insulating film directly contacts said semiconductor layer in a part above each of said gate electrodes, and wherein said first and third masks are configured and dimensioned to prevent impurity doping to a channel region.

6. A method defined in claim 5, wherein removal of said second and third resist films after doping of said second conductivity type impurities is performed using a solution having a higher concentration than that of a solution used in removal of said first resist film after doping of said first conductivity type impurities.

7. A method defined in claim 5, wherein removal of said second and third resist films after doping of said second conductivity type impurities is performed by immersion of said substrate in a solution for a longer time than a time for removal of said first resist film after doping of said first conductivity type impurities.

* * * * *